United States Patent [19]

Chu et al.

[11] Patent Number: 5,434,096
[45] Date of Patent: Jul. 18, 1995

[54] METHOD TO PREVENT SILICIDE BUBBLE IN THE VLSI PROCESS

[75] Inventors: Cheng-Te Chu, Taipei; Yung-Haw Liaw, Hsin-chu; Tien C. Chang, Hsin-chu; Hsin-Chieh Huang, Hsin-chu, all of Taiwan

[73] Assignee: Taiwan Semiconductor Manufacturing Company LTD., Hsinchu, Taiwan

[21] Appl. No.: 318,212

[22] Filed: Oct. 5, 1994

[51] Int. Cl.⁶ .................. H01L 21/336; H01L 21/283
[52] U.S. Cl. ........................... 437/44; 437/200; 437/239; 437/247; 148/DIG. 15; 148/DIG. 147
[58] Field of Search .............. 437/200, 41, 44, 193, 437/247, 239; 148/DIG. 147, DIG. 15

[56] References Cited

U.S. PATENT DOCUMENTS

| | | | |
|---|---|---|---|
| 4,833,099 | 5/1989 | Woo | 437/41 |
| 5,003,062 | 3/1991 | Yen | 437/231 |
| 5,071,788 | 12/1991 | Joshi | 437/192 |
| 5,086,017 | 2/1992 | Lu | 437/200 |
| 5,108,952 | 4/1992 | Matsuhashi | 437/192 |
| 5,128,274 | 7/1992 | Yabu et al. | 437/70 |
| 5,130,266 | 7/1992 | Huang et al. | 437/44 |
| 5,234,850 | 8/1993 | Liao | 437/44 |
| 5,336,625 | 8/1994 | Tong | 437/31 |
| 5,393,685 | 2/1995 | Yoo et al. | 437/44 |
| 5,395,799 | 3/1995 | Yu | 437/200 |

FOREIGN PATENT DOCUMENTS 0173524  3/1986  European Pat. Off. ............ 437/200

OTHER PUBLICATIONS

Sadana, et al., "Annealing and Oxidation ...", J. Appl. Phys., 62(7), 1 Oct. 1987, pp. 2830–2835.
Yoo et al., "Peeling-Free Tungsten Polycide Process . . . ", 1991 Int. Symp. VLSI Tech. Syst. & Appl., May 22–24, 1991, pp. 371–375.

Primary Examiner—T. N. Quach
Attorney, Agent, or Firm—George O. Saile

[57] ABSTRACT

A method is described for fabricating an integrated circuit with polycide gate electrodes in which there is no delamination of the overlying dielectric layer. A polysilicon layer over a gate dielectric is provided on a silicon substrate. A silicide layer is formed over the polysilicon layer using $WF_6$ and $SiH_4$ as the reaction gases. The silicide and polysilicon layers are patterned to form polycide gate electrodes. The substrate is annealed initially in an inert gas atmosphere to remove excess fluorine gas, then in an oxygen atmosphere. Lightly doped source and drain ion implants are performed. Spacers are formed on the sidewalls of the polycide gate electrodes. Source/drain ion implants are performed with include fluoride ions. The substrate is degassed in an inert atmosphere to remove the excess fluoride ions. A dielectric layer is deposited over the pattern of polycide gate electrodes and flowed. There is no excess fluorine gas concentration to form a bubble in the dielectric layer. This completes fabrication of the polycide gate electrodes without delamination in the manufacture of an integrated circuit.

28 Claims, 3 Drawing Sheets

METHOD TO PREVENT SILICIDE BUBBLE IN THE VLSI PROCESS

BACKGROUND OF THE INVENTION

1. Field of the Invention

The present invention relates to the fabrication of integrated circuit devices, and more particularly, to a method of preventing the formation of a bubble at the silicide-BPSG interface after BPSG flow in the fabrication of an integrated circuit.

2. Description of the Prior Art

In the fabrication of polycide gates, it is well known in the art to use tungsten hexafluoride ($WF_6$) gas to form a tungsten silicide layer on a polysilicon gate. In the conventional process, a layer of undoped silicate glass (USG) and borophosphosilicate glass (BPSG) is deposited over the polycide gate and then flowed. It has been observed that a bubble appears at the interface of the silicide layer and the USG/BPSG film after the BPSG flow process. The cause of the bubble, and resulting delamination, appears to be fluorine outgassing from the tungsten silicide film which extrudes a BPSG bubble during the BPSG flow process.

U.S. Pat. No. 5,071,788 to Joshi teaches annealing in a forming gas or pure $H_2$ gas at below 900° C. to reduce the number of fluorine and oxygen ions in the film. U.S. Pat. No. 5,108,952 to Matsuhashi uses $WF_6$ to deposit tungsten on silicon dioxide using a special recipe to prevent peeling of the silicon dioxide and cracking of the tungsten film. These two patents do not address the problem of the BPSG bubble formation.

SUMMARY OF THE INVENTION

Accordingly, it is a primary object of the present invention to provide a process for polycide formation which prevents delamination after BPSG flow.

A method is described for fabricating an integrated circuit with polycide gate electrodes in which there is no delamination of the overlying dielectric layer. A polysilicon layer over a gate dielectric is provided on a silicon substrate. A silicide layer is formed over the polysilicon layer using $WF_6$ and $SiH_4$ as the reaction gases. The silicide and polysilicon layers are patterned to form polycide gate electrodes. The substrate is annealed initially in an inert gas atmosphere to remove excess fluorine gas, then in an oxygen atmosphere. Lightly doped source and drain ion implants are performed. Spacers are formed on the sidewalls of the polycide gate electrodes. Source/drain ion implants are performed with include fluoride ions. The substrate is degassed in an inert atmosphere to remove the excess fluoride ions. A dielectric layer is deposited over the pattern of polycide gate electrodes and flowed. There is no excess fluorine gas concentration to form a bubble in the dielectric layer. This completes fabrication of the polycide gate electrodes without delamination in the manufacture of an integrated circuit.

BRIEF DESCRIPTION OF THE DRAWINGS

In the accompanying drawings forming a material part of this description, there is shown.

DESCRIPTION OF THE PREFERRED EMBODIMENTS

Figure 2:
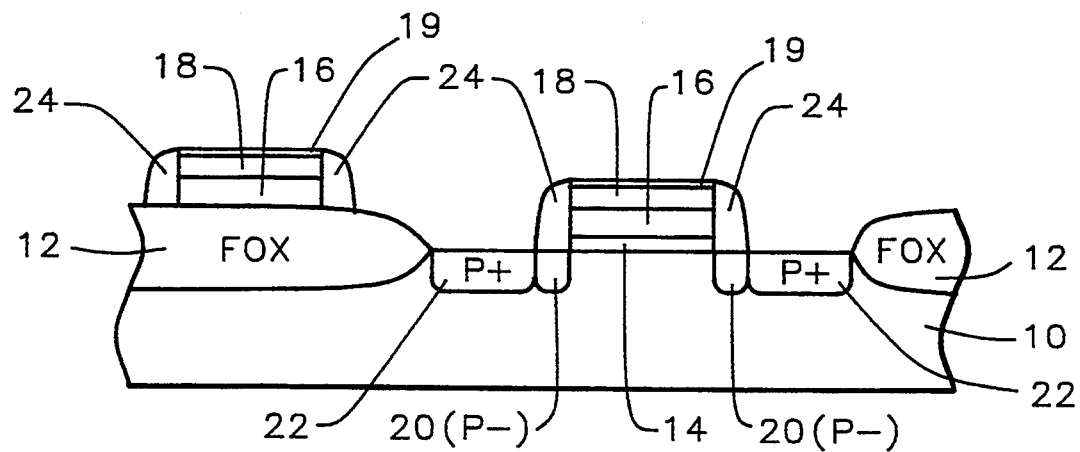
FIGS. 2 and 3 are cross-sectional representations of a preferred embodiment of the present invention.

Referring now more particularly to FIG. 2, there is shown a semiconductor substrate 10, preferably composed of silicon having a (100) crystallographic orientation. In an effort to simplify the description and the drawings the dielectric isolation between devices has been only partially shown and will not be described in detail, because they are conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide or Field OXide pattern, FOX 12. Then semiconductor devices can be provided in the silicon mesas according to the following processes.

The surface of the silicon substrate 10 is thermally oxidized to form the desired gate dielectric silicon oxide 14 thickness. The preferred thickness is between about 100 to 250 Angstroms for devices with submicron feature sizes. The polysilicon layer 16 is blanket deposited by LPCVD (Low Pressure Chemical Vapor Deposition) method. The preferred thickness of the polysilicon layer 16 is between about 1000 to 3000 Angstroms. The polysilicon layer 16 is ion implanted or doped with phosphorus, arsenic, or boron to be a good conductor with sheet resistance of several or several tens ohms per square.

Figure 1:
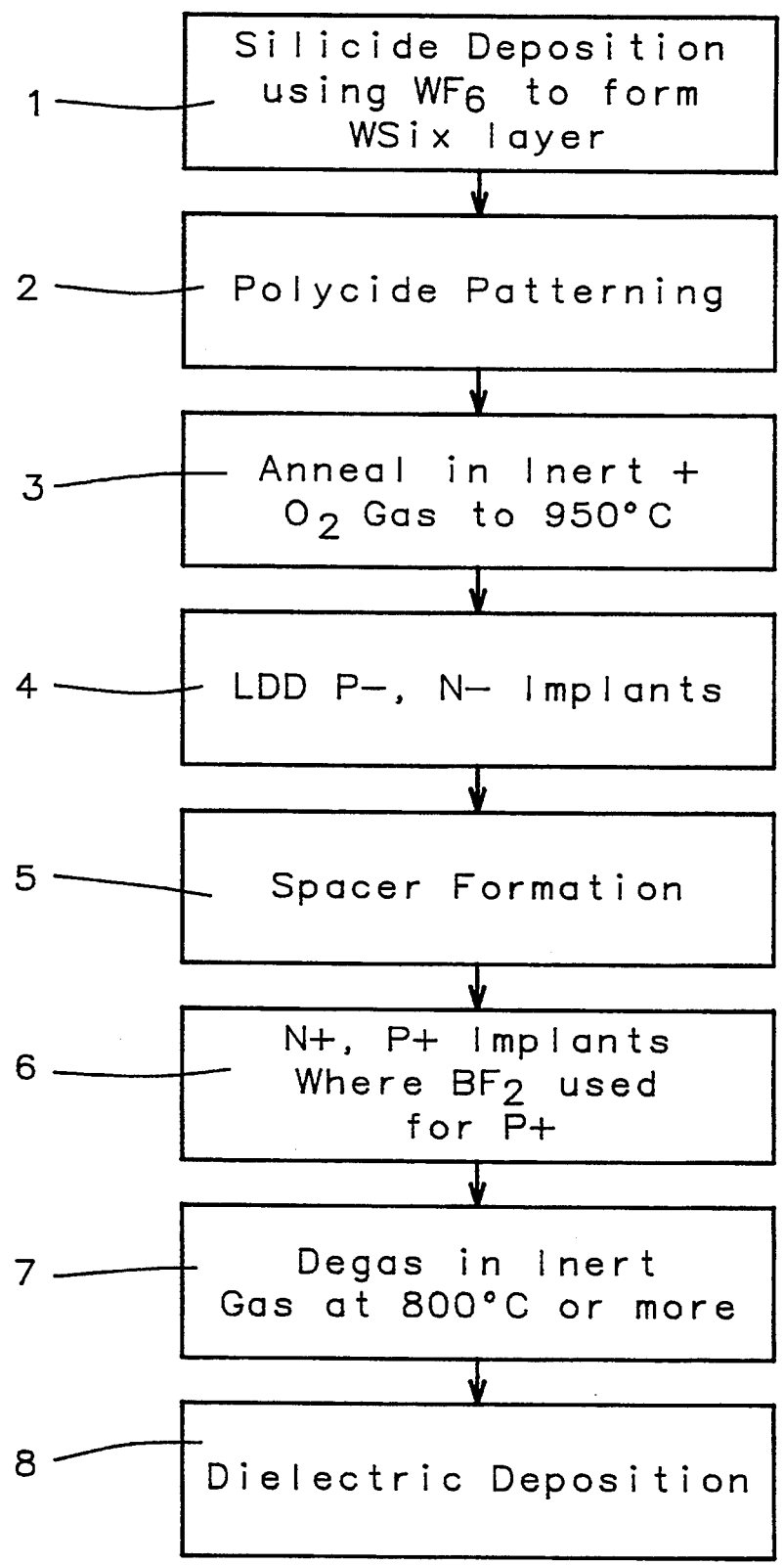
FIG. 1 is a flowchart of the polycide process flow of the present invention.

The polycide process of the present invention will now be described. The process is diagramed in the flowchart illustrated in FIG. 1. The conventional CMOS process has been improved by a modified $WSi_x$ annealing recipe and an additional degassing step before BPSG deposition.

The first step is silicide deposition using $WF_6$ and $SiH_4$ as the source gases which react typically at temperatures of 300° C. and above to form a layer of tungsten silicide $WSi_x$ 18 over the polysilicon layer 16.

In step 2, the layers 14 and 16 are patterned by conventional lithography and anisotropic etching techniques as are conventional in the art to provide a desired pattern of silicide/polysilicon gate electrodes/gate dielectric silicon oxide on the bare silicon device regions substrate 10, the FOX 12 surfaces or elsewhere as seen in FIG. 2.

Figure 5:
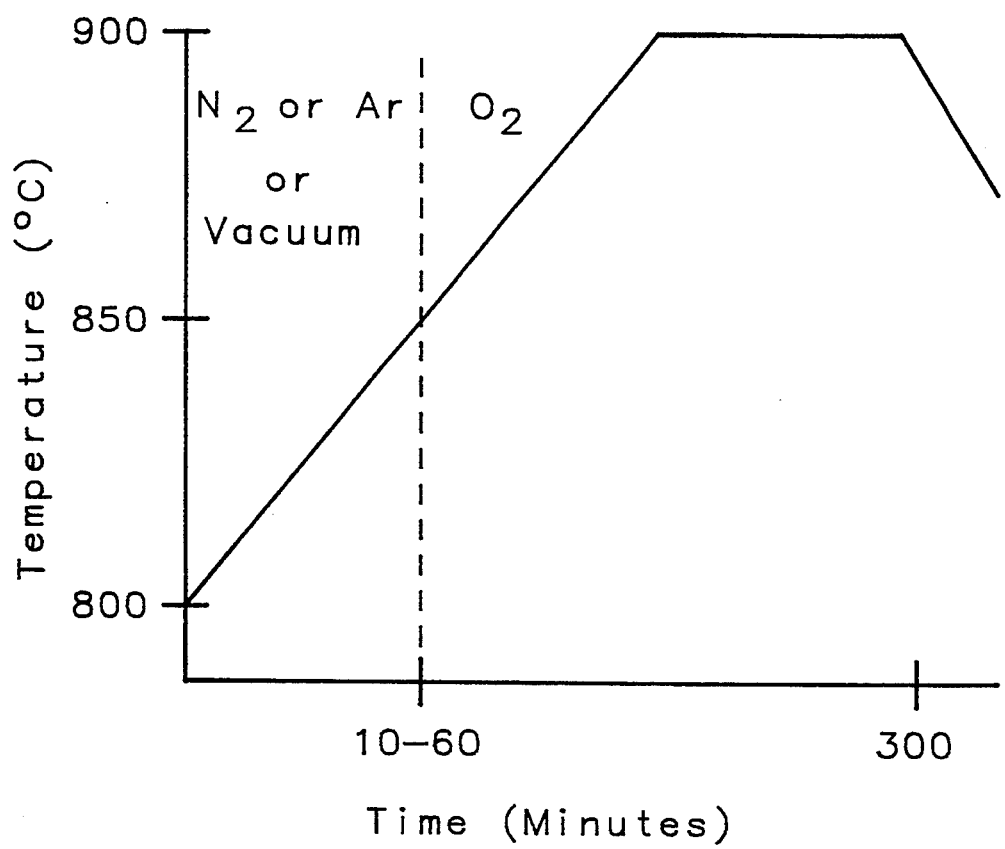
FIG. 5 is a graphical representation of the annealing process of the present invention.

In step 3, the substrate is annealed. Referring to the graph in FIG. 5, the semiconductor wafers enter the annealing furnace at a temperature of about 800° C. in an inert gas atmosphere, such as Argon or Nitrogen or a vacuum. The temperature is ramped up to 900° C. or above. During the time the wafers are in the annealing furnace in the inert atmosphere, the fluorine gas is exhausted from the wafer silicide layer 18. This outgassing is accomplished in between about 10 to 60 minutes. After sufficient time has been allowed for outgassing, oxygen gas is added to the ambient and the temperature is increased to above 850° C. FIG. 5 illustrates one preferred annealing embodiment. Temperatures illustrated can be changed somewhat, achieving the same results. During annealing using oxygen gas, a thin layer of silicon oxide 19 is formed on the tungsten silicide surface. This silicon oxide layer provides a protective cap to the silicide layer.

The lightly doped drain (LDD) source and drain implantation is next. FIG. 2, for example, shows the ion implantations of P-dopants 20, but both N- and P- implantations are performed in the CMOS process. Lithographic masks may be required to protect the areas not to be subjected to that particular N-or P- ion implantation. The formation of the lithographic masks are done by conventional lithography and etching techniques.

The dielectric spacer 24 is now to be formed followed by the completion of the lightly doped drain source/drain structures. An undoped silicon dioxide or silicon nitride with a preferred thickness of between about 2000 to 3000 Angstroms is chemical vapor deposited and anisotropically etched to form the dielectric spacer layer 24 on the sidewalls of the layer structures 14, 16, and 18. The preferred anisotropic etching uses a conventional reactive ion etching ambient.

The N+ source/drain ion implantation, not shown, uses arsenic with a high-dose of between about 1 E 15 to 5 E 15 atoms/cm$^2$ and energy of between about 50 to 100 KeV. The P+ source/drain ion implantation 22 uses $BF_2$ ions with a high-dose of between about 1 E 15 to 5 E 15 atoms/cm$^2$ and energy of between about 50 to 100 KeV.

The additional degassing step 7 of the invention is performed after the $BF_2$ implantation. The wafer is degassed in an inert atmosphere, such as $N_2$, Ar, or a vacuum, at a temperature of about 800° C. or more for about 20 minutes or more. It is believed that this degassing will remove particularly fluorine gas from the $WF_6$ reaction gas and from the $BF_2$ implantation. This fluorine gas is suspected of causing the delamination problem.

Figure 3:
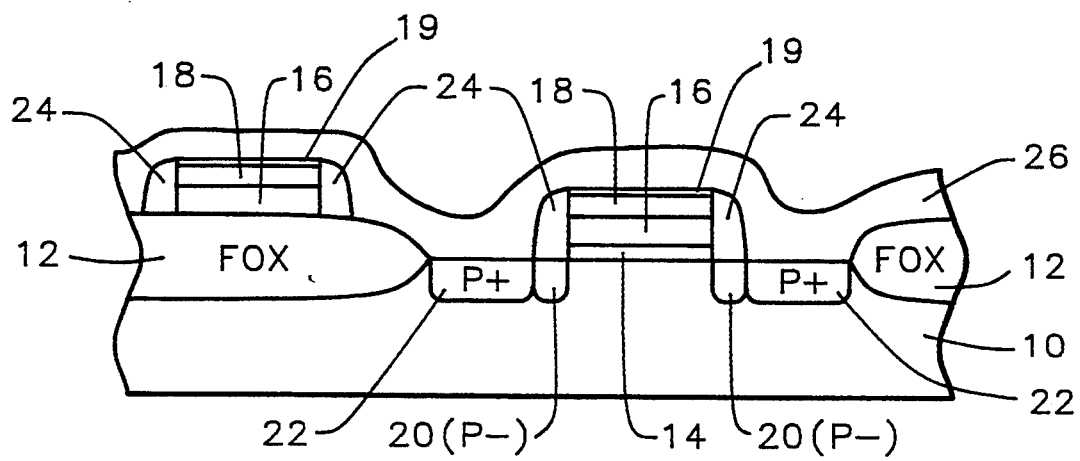

A dielectric layer 26, composed of borophosphosilicate glass (BPSG) or borophosphoietraethoxysilane (BPTEOS) with an underlayer of undoped silicate glass (USG) is blanket deposited over the surface of the substrate to a preferred thickness of between about 3000 to 11,000 Angstroms, as shown in FIG. 3.

Figure 4:
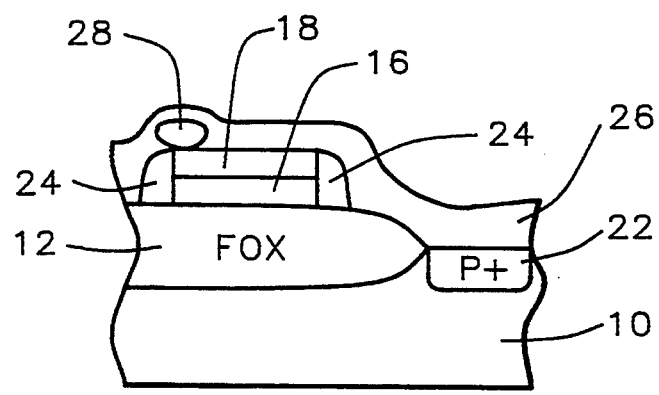
FIG. 4 is a cross-sectional representation of the delamination problem of the prior art.

Referring now to FIG. 4, there is shown the same structures and layers as described above for FIGS. 2 and 3. However, in this prior art process, the conventional WF6 annealing recipe with no degassing was used. A bubble 28 is formed by the outgassing of fluorine from the silicide layer 18 during the BPSG flow process.

Returning to FIG. 3 of the present invention, the BPSG layer 26 is flowed at between about 800° to 1000° C. Because of the reduction of the fluorine concentration brought about by the modified annealing step and the additional degassing step, no bubble is formed at the silicide-USG/BPSG interface. The process of the present invention has been put into production; no delamination occurs.

While the invention has been particularly shown and described with reference to the preferred embodiments thereof, it will be understood by those skilled in the art that various changes in form and details may be made without departing from the spirit and scope of the invention.

What is claimed is:

1. The method of manufacture of an integrated circuit comprising:

providing, on a silicon substrate, a polysilicon layer over a gate dielectric;

forming a silicide layer over said polysilicon layer and patterning said silicide and said polysilicon layers to form a pattern of polycide gate electrodes;

annealing said substrate initially in an inert atmosphere and subsequently in an oxygen atmosphere;

performing lightly doped source/drain ion implants into said substrate;

forming spacers on the sidewalls of said polycide gate electrodes;

performing source/drain ions implants into said substrate;

degassing said substrate in an inert atmosphere; and depositing a dielectric layer over said pattern of polycide gate electrodes and flowing said dielectric layer to complete manufacture of said integrated circuit.

2. The method of claim 1 wherein said silicide layer is formed using $WF_6$ and $SiH_4$ as reaction gases to form a tungsten silicide layer overlying said polysilicon layer.

3. The method of claim 1 wherein said annealing in an inert atmosphere is performed for a duration of between about 10 to 60 minutes at temperature of greater than about 800° C. and wherein said annealing exhausts fluorine gas from said silicide layer.

4. The method of claim 3 wherein said inert atmosphere comprises nitrogen gas.

5. The method of claim 3 wherein said inert atmosphere comprises argon gas.

6. The method of claim 1 wherein said annealing in an oxygen atmosphere is performed for a duration of between about 10 to 300 minutes at a temperature of up to greater than about 850° C. and wherein said annealing causes the formation of a silicon oxide capping layer over said silicide layer.

7. The method of claim 1 wherein said source/drain implants use $BF_2$ ions and wherein said degassing step is performed at a temperature of about 800° C. or greater.

8. The method of claim 7 wherein said inert atmosphere comprises nitrogen gas.

9. The method of claim 7 wherein said inert atmosphere comprises argon gas.

10. The method of claim 7 wherein said inert atmosphere comprises a vacuum.

11. The method of claim 1 wherein said dielectric layer is composed of borophosphosilicate glass and an underlayer of undoped silicate glass and wherein said layer is flowed at between about 850° to 1000° C.

12. The method of manufacture of an integrated circuit comprising:

providing, on a silicon substrate, a polysilicon layer over a gate dielectric;

forming a silicide layer over said polysilicon layer and patterning said silicide and said polysilicon layers to form a pattern of polycide gate electrodes;

annealing said substrate initially in an inert atmosphere and subsequently in an oxygen atmosphere;

performing lightly doped source/drain ion implants into said substrate;

forming spacers on the sidewalls of said polycide gate electrodes;

performing source/drain $BF_2$ ions implants into said substrate;

degassing said substrate in an inert atmosphere; and depositing a dielectric layer over said pattern of polycide gate electrodes and flowing said dielectric layer to complete manufacture of said integrated circuit.

13. The method of claim 12 wherein said silicide layer is formed using $WF_6$ and $SiH_4$ as reaction gases to form a tungsten silicide layer overlying said polysilicon layer.

14. The method of claim 12 wherein said annealing in an inert atmosphere is performed for a duration of between about 10 to 60 minutes at temperature of greater than about 800° C.

15. The method of claim 12 wherein said annealing in an oxygen atmosphere is performed for a duration of between about 10 to 300 minutes at a temperature of more than about 850° C. and wherein said annealing causes the formation of a silicon oxide capping layer over said silicide layer.

16. The method of claim 12 wherein said degassing is performed in an inert atmosphere at a temperature of greater than about 800° C. or greater.

17. The method of claim 12 wherein said dielectric layer is composed of borophosphosilicate glass and an underlayer of undoped silicate glass and wherein said layer is flowed at between about 800° to 1000° C.

18. The method of forming polycide gate electrodes without delamination of the overlying dielectric layer in the manufacture of an integrated circuit comprising:
providing, on a silicon substrate, a polysilicon layer over a gate dielectric;
forming a silicide layer over said polysilicon layer using a fluoride gas and patterning said silicide and said polysilicon layers to form a pattern of polycide gate electrodes;
annealing said substrate initially in an inert atmosphere wherein said annealing removes excess fluorine gas and subsequently in an oxygen atmosphere to form a silicon oxide capping layer over said silicide layer;
performing lightly doped source/drain ion implants into said substrate;
forming spacers on the sidewalls of said polycide gate electrodes;
performing source/drain ion implants into said substrate wherein said implants include fluoride ions;
degassing said substrate in an inert atmosphere wherein said degassing removes excess fluorine gas from said substrate; and
depositing a dielectric layer over said pattern of polycide gate electrodes and flowing said dielectric layer wherein no fluorine gas bubble is formed within said dielectric layer to complete formation of said polycide gate electrodes without delamination in the manufacture of said integrated circuit.

19. The method of claim 18 wherein said silicide layer is formed using $WF_6$ and $SiH_4$ as reaction gases to form a tungsten silicide layer overlying said polysilicon layer.

20. The method of claim 18 wherein said annealing in an inert atmosphere is performed for a duration of between about 10 to 60 minutes at temperature of greater than about 800° C. and wherein said annealing exhausts fluorine gas from said silicide layer.

21. The method of claim 20 wherein said inert atmosphere comprises nitrogen gas.

22. The method of claim 20 wherein said inert atmosphere comprises argon gas.

23. The method of claim 18 wherein said annealing in an oxygen atmosphere is performed for a duration of between about 10 to 300 minutes at a temperature of more than about 850° C.

24. The method of claim 18 wherein said degassing is performed in an inert atmosphere at a temperature of greater than about 800° C.

25. The method of claim 24 wherein said inert atmosphere comprises nitrogen gas.

26. The method of claim 24 wherein said inert atmosphere comprises argon gas.

27. The method of claim 24 wherein said inert atmosphere comprises a vacuum.

28. The method of claim 18 wherein said dielectric layer is composed of borophosphosilicate glass and an underlayer of undoped silicate glass and wherein said layer is flowed at between about 800° to 1000° C.

* * * * *